(12) United States Patent
Esmark et al.

(10) Patent No.: US 7,694,247 B2
(45) Date of Patent: Apr. 6, 2010

(54) IDENTIFICATION OF ESD AND LATCH-UP WEAK POINTS IN AN INTEGRATED CIRCUIT

(75) Inventors: Kai Esmark, Neuried (DE); Harald Gossner, Riemerling (DE); Wolfgang Stadler, München (DE); Marin Streibl, Petershausen (DE)

(73) Assignee: Infineon Technologies AG, Munich (DE)

( * ) Notice: Subject to any disclaimer, the term of this patent is extended or adjusted under 35 U.S.C. 154(b) by 394 days.

(21) Appl. No.: 10/569,986

(22) PCT Filed: Mar. 17, 2005

(86) PCT No.: PCT/EP2004/009591
§ 371 (c)(1),
(2), (4) Date: Feb. 2, 2007

(87) PCT Pub. No.: WO2005/024672
PCT Pub. Date: Mar. 17, 2005

(65) Prior Publication Data
US 2007/0165344 A1    Jul. 19, 2007

(51) Int. Cl.
*G06F 17/50* (2006.01)
(52) U.S. Cl. .............................. 716/4; 716/5
(58) Field of Classification Search .......... 716/4–5
See application file for complete search history.

(56) References Cited

U.S. PATENT DOCUMENTS

| | | | |
|---|---|---|---|
| 6,493,850 B2 * | 12/2002 | Venugopal et al. ........... | 716/4 |
| 6,591,233 B1 | 7/2003 | Sonoda | |
| 6,941,257 B2 * | 9/2005 | Roesner et al. ............. | 703/15 |
| 7,278,056 B2 * | 10/2007 | Hekmatpour ............... | 714/37 |
| 7,373,289 B2 * | 5/2008 | McGaughy et al. .......... | 703/14 |
| 2002/0144213 A1 | 10/2002 | Ramaswamy et al. | |
| 2002/0152447 A1 | 10/2002 | Venugopal et al. | |

(Continued)

FOREIGN PATENT DOCUMENTS

WO    WO 2005/024672 A1    3/2005

OTHER PUBLICATIONS

Lee, Jaesik et al. "Chip-Level Simulation for CDM Failures in Multi-Power ICs." *EOS/ESD Symposium Proceedings 2000.* p. 456-464.

(Continued)

*Primary Examiner*—Vuthe Siek
(74) *Attorney, Agent, or Firm*—Maginot, Moore & Beck

(57) ABSTRACT

A program-controlled arrangement for the identification of ESD and/or latch-up weak points in the design or in the concept of an integrated circuit comprises a pre-processor, which processes first data about the description of the integrated circuit, second data about already ESD-characterized circuit parts of the integrated circuit, and third data which contain information about ESD test standards. A simulator device is connected downstream of the pre-processor which has a simulator which, by using the fourth and fifth data generated by the pre-processor, performs an ESD simulation of the integrated circuit, which has a monitoring controller for controlling the ESD simulation sequence in the simulator. An analysis device is connected downstream of the simulator device, which performs an evaluation of the sixth data generated in the simulator device with regard to their physical validity and meaningfulness, and marks the simulation runs having physically relevant ESD failure events.

20 Claims, 4 Drawing Sheets

U.S. PATENT DOCUMENTS

2003/0147187 A1    8/2003    Voldman

OTHER PUBLICATIONS

Baird, Michael and Richard Ida. "VerifyESD: A Tool for Efficient Circuit Level ESD Simulations of Mixed-Signal ICs." EOS/ESD Symposium Proceedings, IEEE, S. Sep. 2000. (pp. 465-469).

Lee, Jaesik et al. "Chip-Level Simulation for CDM Failures in Multi-Power ICs." EOS/ESD Symposium, Anaheim, CA, Sep. 2000. (pp. 4A71-4A79).

Lee, Jaesik et al. "VeriCDF: A New Verification Methodology for Charged Device Failures." *DAC*. New York: ACM, 2002. (pp. 874-879).

Li, T. et al. "Automated Extraction of Parasitic BJTs for CMOS I/O Circuits under ESD Stress." *Integrated Workshop Final Report*. IEEE, 1997. (pp. 103-109).

* cited by examiner

IDENTIFICATION OF ESD AND LATCH-UP WEAK POINTS IN AN INTEGRATED CIRCUIT

FIELD OF THE INVENTION

The invention relates to a program-controlled arrangement and a method for the identification of ESD and latch-up weak points in the design or in the concept of an integrated circuit.

BACKGROUND

Semiconductor circuits integrated into a semiconductor chip contain what are known as ESD protective circuits to protect the inputs or outputs (I/O ports) against electrostatic overvoltages and electrostatic discharge (ESD=electrostatic discharge) caused as a result. ESD protective elements can be formed, for example, as thyristors, bipolar transistors, diodes or a mixture thereof. ESD protective elements are known generally in a large number of embodiments, so that their construction and function will not be discussed in more detail below.

These ESD protective circuits are typically connected between an input path of an integrated circuit and the input or output terminal to be protected and ensure that, if a parasitic overvoltage pulse is injected which, in the extreme case, could lead to the destruction of the integrated circuit, the ESD protective element turns on and the parasitic overvoltage pulse is thus conducted away.

It is important in this case to know the ESD interference pulse expected as accurately as possible, in order therefore to adapt the design and the dimensioning of the corresponding ESD protective structure as well as possible thereto. For the simulation of an interference signal injection, use is very frequently made of what is known as the human body model (HBM), which simulates parasitic peak currents of a few amperes lasting about 100 ns. The equivalent circuit of the HBM model provides for a low-pass filter consisting of a capacitance of about 100 pF and a resistance of about 1.5 kΩ. The HBM model is usually used when the interference pulse expected is caused by a human. Alternatively, it would also be conceivable for the ESD pulse to be caused by metallic objects. In this case, what is known as the machine model (MM) is used. Furthermore, there also exist other models, such as what is known as the charged device model (CDM), in which it is assumed that the integrated circuit is itself charged out and an interference pulse arises as a result of a discharge to earth. These models are used to simulate a parasitic interference pulse to be expected and are used to design the corresponding ESD protective structures to match the interference pulse to be expected.

With the continuing increasing complexity involved in electronic systems and integrated circuits, for example applicator-specific integrated circuits (ASICs) or "systems on chips" (SOCs), greater and greater significance is assigned to the test and the verification of just to these circuits and systems. During this verification, the relevant system characteristics are qualified and quantified.

Furthermore, the importance of the ESD protection in integrated circuits rises with the requirements on operating speed, which is higher and higher, a lower operating voltage, a higher packing density of the individual components and the special requirement of providing more and more beneficial circuits. This generally leads to thinner and thinner dielectric layers, higher doping concentrations with abrupt doping transitions and higher electric fields occurring. Each of these factors leads to an increased sensitivity of the ESD effects.

Added to this is the fact that the system characteristics of highly complex integrated circuits are increasingly determined by the interaction of the integrated hardware with the application software which, for example, is provided by a device manufacturer, so that in modern systems the hardware can no longer be evaluated separately from the application software. Since, typically, the major part of the hardware-based system characteristics are already defined at a very early development phase, it is critical that, in interaction with the application software, the respectively optimal architecture which, in particular, is optimized with regard to ESD protection, is determined.

Despite optimal design of the ESD protective structures on the integrated circuit to be protected, in general the removal of the ESD sensitivity can never be wholly eliminated. The cause of this lies in the increasing complexity of the integrated circuits, in which, even adjacent circuit blocks can have a mutually positive or else negative influence. This influencing of adjacent circuit parts becomes all the more serious the smaller the respective circuit parts are formed and the more densely the adjacent circuit parts are arranged in relation to one another. This mutual influencing of individual circuit parts of the integrated circuit is caused by the specific design of this integrated circuit. Information as to how a specific design of an integrated circuit will affect the ESD protection can currently be obtained only after the design phase, for example by using a prototype of the integrated circuit. As a result, in the extreme case, this can lead to a redesign of the circuit. However, the problem with this is that the development cycles for highly integrated circuits in modern CMOS, BICMOS or bipolar technologies are becoming shorter and shorter. In addition to the loss in time for a requisite redesign, this measure is also costly, since here the different mask sets very frequently have to be adapted to the new design.

At present, ESD protection is in each case provided for individual components or circuit parts of an integrated circuit. Here, by means of suitable adaptation of the design rules and dimensions, optimal protection for just these components can be obtained. However, it is a problem that, here, a mutual influence of adjacent circuit blocks is not taken into account. Adjacent circuit blocks can have a positive or else negative influence with regard to the ESD pulses injected. In the case of a positive influence, this means that, for example, the ESD protection for a circuit part is normally over-dimensioned or is even unnecessary. In the case of a negative influence, however, it is possible for the ESD protection for a circuit part, which is typically adequate for this circuit part, now to be inadequate because of the negative influence of adjacent circuit parts, which, in the extreme case, could lead to the integrated circuit being damaged or destroyed in the event that a parasitic overvoltage pulse is injected.

For some time, therefore, great efforts have been made also to permit the design for the assessment of the ESD resistance of an integrated circuit with the complexity of a typical digital or mixed-signal IC. In this case, as early as in the design phase, an integrated circuit is examined for its ESD functionality and therefore for its ESD protective action by means of a virtual ESD test.

The particular difficulty resides here in particular in the complexity of the physical mechanisms and the necessity of simulating all of the integrated circuit, since only in this way can critical ESD current paths be found. The problem with this is that the methods available nowadays entail such a great deal of effort on configuration and extraction that a simulation of the ESD protection of an entire semiconductor chip could barely be used productively for the verification of the integrated circuit in the pre-chip phase. A commercial solution to this simulation task is currently not available.

FIG. 1 shows the structure of a known ESD simulation system for the ESD verification of an integrated circuit, as disclosed by U.S. Pat. No. 6,493,850 B2. In this case, FIG. 1 results from combining FIGS. 1 and 2 of U.S. Pat. No. 6,493,850 B2.

The ESD simulation system 100 described there has a pre-processor 100 which, on the output side, generates simulation data 120 which are supplied to the simulator 130. Connected downstream of the simulator 130 is a post-processor 140 and an output data generator 150 connected downstream of the latter. The core of the ESD simulation system in U.S. Pat. No. 6,493,850 B2 is the pre-processor 110, which is used to obtain the simulation data. The pre-processor 110 has four information generators 210, 220, 230, 240. The first information generator 210 produces a network list from the layout data 212 (layout file) and the data for the individual wiring patterns of the various components 213 (schematic file). The second information generator 220 generates a component model 221. The third information generator 230 generates data 231 for what is known as a safe operating state (safe operating file) for the entire integrated circuit. In the fourth information generator 240, the simulation conditions 241 are provided. The data 211, 221, 231, 241 are injected together into a translator 250, which generates the simulation input data 120 for the simulator 130 therefrom.

For the quantitative identification of the ESD sensitivities and latch-up effects in a design of an integrated circuit, even before the production of the integrated circuit, the data 211, 221, 231, 241 are combined and a simulated, quantified ESD event is applied to the design of the integrated circuit. The ESD sensitivities resulting from this on the design elements are observed and analysed quantitatively. Critical stress values in the design are assessed and failures of ESD protective elements are recorded. After running through the entire simulation, finally a list of those ESD protective elements and locations which function correctly and those which have failed is output. This information can be used for optimizing the design with regard to improved ESD protection.

In order to assess the ESD resistance of a design, however, in U.S. Pat. No. 6,493,850 a great deal of effort on extraction and modelling is required on the basis of the requirement for a very high and accurate simulation of the physical model of the integrated circuit. The high effort on extraction results in particular from the fact that, here, the simulation is carried out at the layout level of the integrated circuit. For the simulation, exorbitantly high computing power, and therefore a very long computation time, are therefore necessary, which lengthens the pre-development phase of the integrated circuit overall.

The simulation of the ESD sensitivities is, moreover, highly dependent on the accurate knowledge of a physical model of the integrated circuit. However, this is not always available, so that the reliability of the simulation here is not particularly high.

A further disadvantage is that variations in the technological parameters and the design environment are not taken into account here during the simulation of the ESD sensitivity.

In U.S. Pat. No. 6,493,850 B2, the ESD verification is performed only on a complete layout of the integrated circuit. Verification before the layout phase, for example during or immediately after the design phase or product definition phase, is not possible here, so that the ESD test data are available only relatively late, which means that the development time of the integrated circuit lasts for a relatively long time.

SUMMARY

The present invention is therefore based on the object of providing an arrangement and a method for the quantitative simulation of an ESD event for an integrated circuit in or immediately after the design phase. In particular, the arrangement of the method should be sufficiently flexible to cover an extremely wide range of integrated circuits and an expanded range of design, process and technological variations. A further object is to reduce the development cycles and, in particular, the design cycles in the case of newly developed integrated circuits.

At least one of these objects is achieved by a system and by a method of having the features of embodiments of the invention.

Embodiments of the invention involve finding weak points in the ESD concept of an integrated circuit of a very high complexity in a very early design and concept phase and to correct them specifically. For this purpose, according to the invention, a (computer) system and a simulation method are provided, with which the ESD characteristics of a semiconductor chip to be developed with an integrated circuit implemented thereon can be determined and analysed in a very early development stage, by software applications being applied to a virtual ESD model of the integrated circuit.

The detection in good time of an ESD weak point which is caused by the design of an integrated circuit, by means of a virtual ESD verification during the design phase, leads to it being possible for integrated circuits with optimal ESD protection to be provided which, in particular, are developed and verified very quickly and can thus be produced more cost-effectively.

The method according to the invention and the arrangement according to the invention differ from the subject-matter of U.S. Pat. No. 6,493,850 B2 substantially as follows:

1. According to the invention, an efficient, highly abstracted network list for the ESD simulation is created. The network list according to the invention does not contain all the data required for the mapping of an integrated circuit. The input data or the data from the network list are instead not yet finally defined and can still be modified on the basis of the further simulation. In addition, the extent of the data is reduced considerably here, since the input data are present in very abstract form.

This reduced network list according to the invention forms the core of the method and system according to the invention. However, the network list should have at least data about the following key elements of an integrated circuit:

metallic connections in the housing of the integrated circuit (package routing, bond-out, etc.);

bus resistors;

ESD protective elements, including their behaviour during ESD operation;

circuit elements which contribute significant ESD current paths to the overall current distribution;

critical parasitic components, which define additional boundary conditions for maximum permissible voltage differences or current distributions.

2. The availability of the ESD data relating to the ESD simulation and required for the simulation, in particular the data for the ESD network list, are incorporated already in the early phase of the design. As a result, necessary ESD protective measures can be provided in good time in the design phase. The final layout and also the final wiring of the individual components need not be completely present at this time. It is therefore also sufficient if these are therefore present incompletely and in portions.

3. There is a hierarchical simulation approach, in order to the able to replace already ESD-simulated or ESD-tested blocks of the integrated circuit by a simplified, abstracted ESD model during the simulation of the overall system. At the same time, this means that the data from those circuit parts or circuit blocks which have already been simulated with regard to ESD protection can be used again for similar circuit blocks, circuit parts or circuit elements (cells), so that it is possible to dispense with additional simulation there. In this way, unnecessary, continuously repeated assessment of the same cells of an integrated circuit is avoided, which means that the stability and speed of the simulation of the entire integrated circuit is increased.

4. According to the invention, a simulatory description of the ESD behaviour of circuit elements, ESD protective elements and parasitic elements is made. In the process, in particular the following physical characteristics are depicted with the least possible effort on simulation and the best possible convergence behaviour:
   the characterization of the breakdown and high-current behaviour of the elements mentioned;
   the description of the possible occurrence of snap-back behaviour, such as occurs in thyristors and bipolar transistors;
   the characterization of the dependence of snap-back behaviour and of the breakdown behaviour on transient effects, that is to say during fast voltage and current transients, as are typical of many ESD events;
   failure criteria for current and voltage drop.

5. According to the invention, in the simulation account is also taken of inaccuracies, scatter and/or technology-induced fluctuations in the ESD-critical component parameters. Furthermore, a reliable identification of what are known as worst-case configurations is also made. In this worst-case consideration, as far as possible all the conditions, influences and changes are also incorporated, so that here independence is provided in particular in the case of a change in the external parameters, such as the temperature, technological parameters or process parameters. The method according to the invention is therefore also verified with regard to the ESD characteristics for such a worst-case consideration.

6. The special advantage is, moreover, that very much reduced effort has to be expended for the modelling of the ESD elements and the integrated circuit than is the case in known methods and systems. Previous compact simulation approaches have, inter alia, hitherto not led to productive simulation solutions since, on account of the high effort on extraction and characterization for the complex ESD compact models, the appropriate simulation apparatus could not be provided in good time, nor with justifiable resources. The simulation system according to the invention, which operates with highly simplified models but with sufficient certainty, does not have these disadvantages. The reason for this is that the simulation system according to the invention, as distinct from the previous solutions, performs a permutational analysis of the ESD characteristics. This permutational approach is based on a method derived from the Monte Carlo method. From a mathematical point of view, a specific permutation of the ESD modes of circuit elements or circuit blocks is made, in order to extract the worst-case state reliably. In order to reduce the effort further, not all the possible permutations but only the permutations classified as critical by the pre-processor are simulated through.

The advantage here lies in particular in the fact that the actual behaviour does not have to be simulated with complex, physically exact models and detail, for example a network list which is true to life. Instead, it is sufficient for the most critical of all the conceivable configurations to be found reliably. This is done, for example, by trying out the correspondingly relevant permutations and subsequently filtering out the worst case. This permits considerable simplification and acceleration of the entire ESD simulation as compared with known methods and arrangements, as disclosed by U.S. Pat. No. 6,493,850 B2 mentioned at the beginning.

Advantageous refinements and developments of the invention emerge from the following subclaims and the description, with reference to the drawing.

BRIEF DESCRIPTION OF THE DRAWINGS

The invention will be explained in more detail below by using the exemplary embodiments indicated in the schematic figures of the drawing, in which.

DETAILED DESCRIPTION

In FIGS. 2-6, identical and functionally identical elements, features and signals, if not otherwise specified, have been provided with the same reference symbols.

Figure 1:
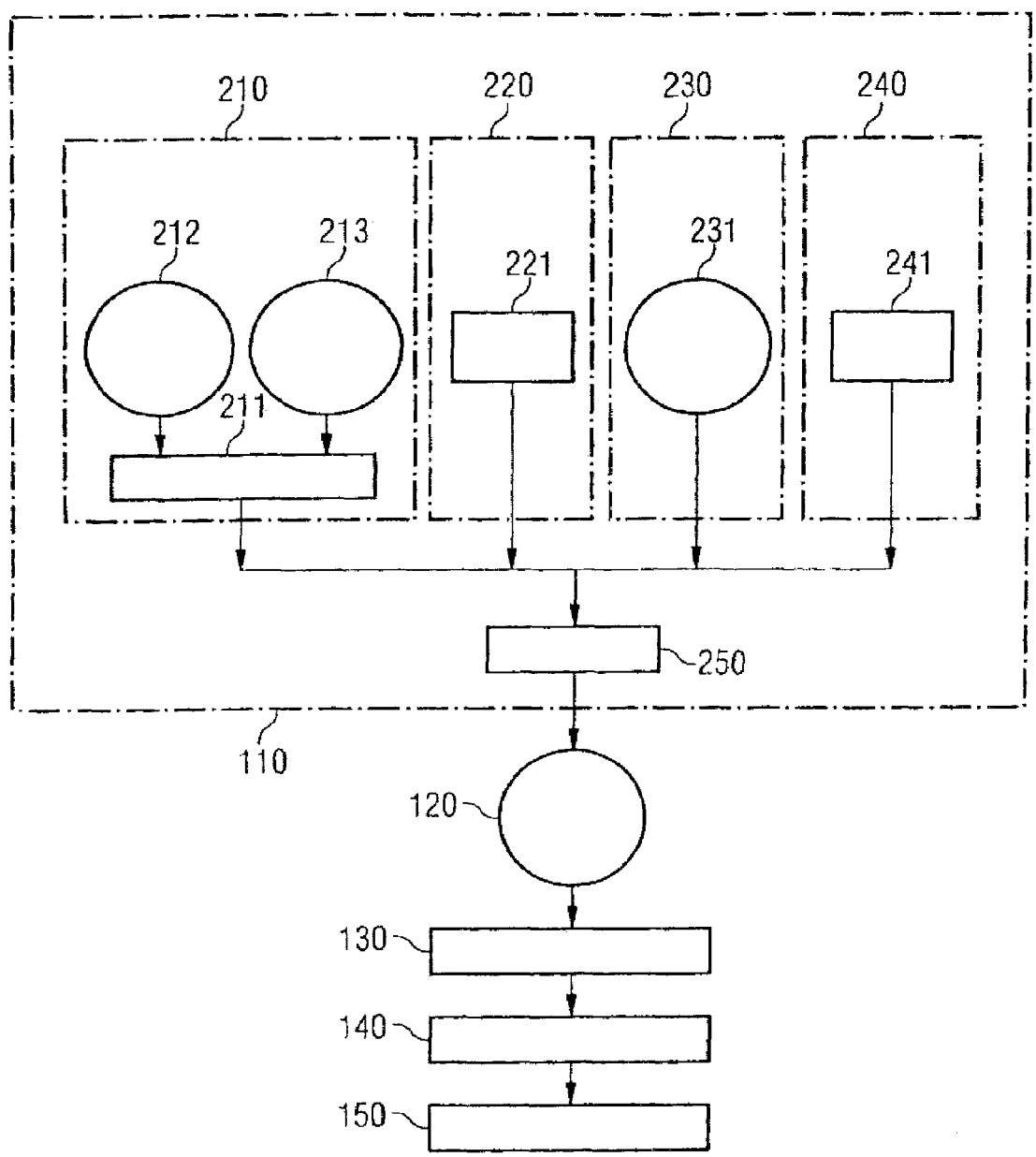
FIG. 1 shows the structure of a known ESD simulation system for the ESD verification of an integrates circuit after the design phase, as disclosed by U.S. Pat. No. 6,493,850 B2.
Figure 2:
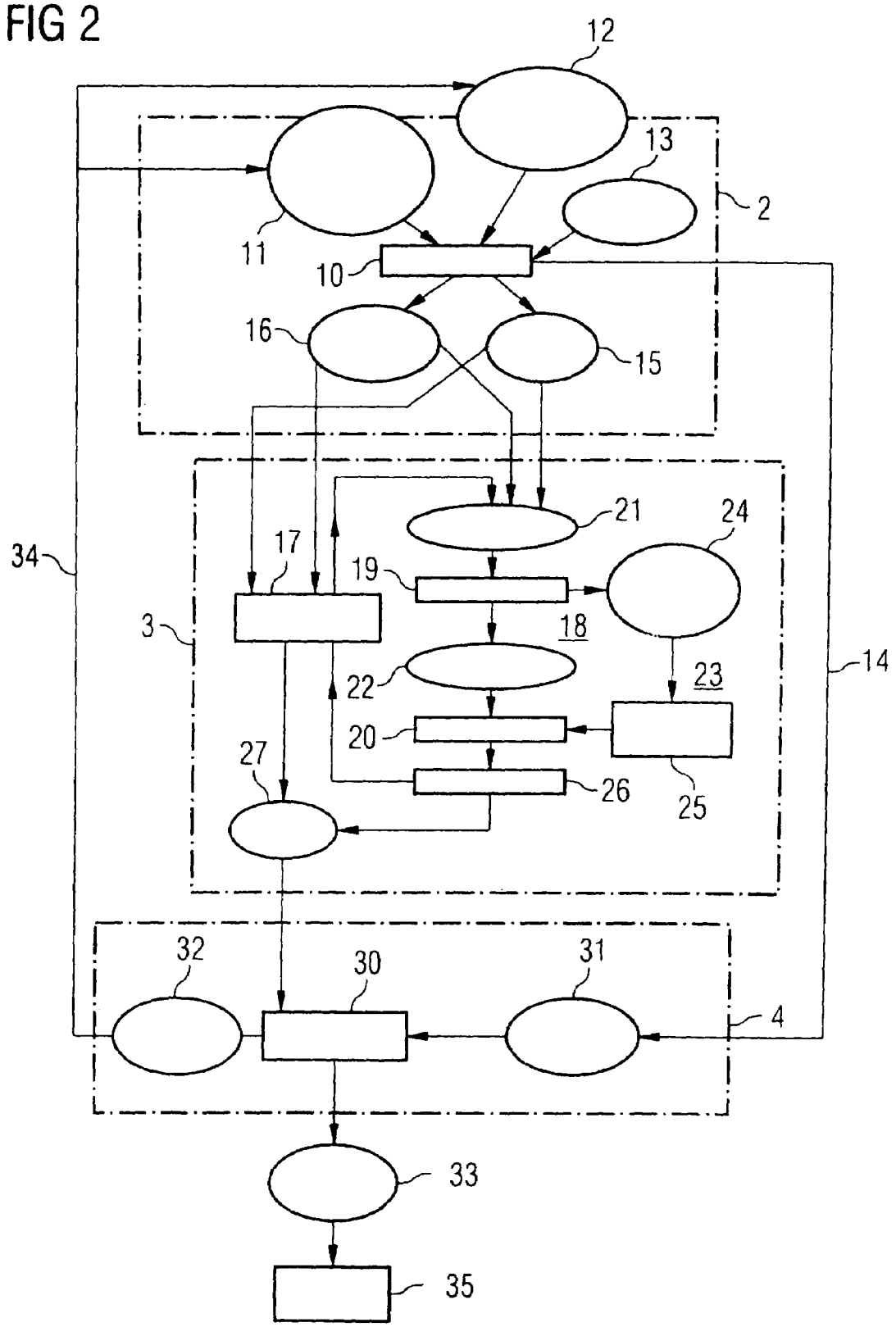
FIG. 2 shows the structure of an ESD simulation system according to the invention to illustrate the ESD simulation according to the invention for the verification of an integrated circuit in the design phase.

FIG. 2 shows the structure of an ESD simulation system according to the invention to illustrate the ESD simulation according to the invention for verification of an integrated circuit already in the pre-chip phase or in the design phase.

In FIG. 2, the ESD simulation system according to the invention is designated by reference symbol 1. The ESD simulation system 1 according to the invention can be organized in abstract form into three parts 2, 3, 4:
   a) a documentation system 2 for the ESD concept;
   b) an ESD test simulator 3;
   c) an analysis system 4.

In this case, the analysis system 4 is connected downstream of the ESD test simulator 3 which, in turn, is connected downstream of the documentation system 2. In addition, the analysis system 4 can contain an output generator 5 to output the simulation data determined by the simulation system 1.

In the following text, the detailed structure and the accurate functioning of the ESD simulation system 1 from FIG. 2 are to be described exactly. In this case, the hardware components of the simulation system 1 are designated by rectangular blocks, whereas the corresponding data, for example input data, output data, simulation data, etc., are designated by round blocks.

The documentation system 2 contains a pre-processor 10. Data 11-13 are supplied to the pre-processor 10. The data 11 contain the data of the chip description of the integrated circuit to be developed. The data 11 thus contain a description of design and product, for example data about the pad ring, housing (package), bond-out chip, the individual cells of the integrated circuit and their connections, the I/O ports, etc. These data 11 are present at a very high level of abstraction. The data 11 therefore contain concept data for the integrated circuit, that is to say a schematic or schematized description of the integrated circuit which, for example, is comprehensible to the user. As distinct from this, the complete data for a complete network list of an integrated circuit is extraordinarily complex and no longer comprehensible to or capable of being handled by the user. The data 12 from the ESD database contain already ESD-verified and ESD-characterized circuit elements or circuit parts of an integrated circuit. The data 12 are stored in an ESD database (building block database). The data 12 thus contain what are known as safe operating states, that is to say electric parameters within which the integrated circuit is capable of functioning. The data 13 contain data from the various ESD test standards, for example whether an HBM model, an MM model and/or a CDM model is now to be used.

The data 11-13 are injected together into the pre-processor 10 and are processed there. From the data 11-13, the pre-processor 10 generates input data 15, 16 for the simulation in the ESD simulator 3. The input data 15 correspond approximately to the data from a network list for the integrated circuit. However, these data 15 have not yet been defined but can still be modified on the basis of further simulation. In addition, their data extent is considerably smaller here, since in particular the input data 11 are present in very abstract form. The pre-processor 10 also generates input data 16 which contain an ESD stress plan. An ESD stress plan is to be understood as a list of ESD individual events which are processed by the simulator. The data from the network list 15 and the data from the ESD stress plan 16 are injected into the ESD simulator 3.

In addition, the pre-processor 10 derives additional analytical criteria for the entire integrated circuit on the basis of the product description, and processes these with the data from the database. These analytical data, which are already present, are advantageously not injected into the ESD test simulator 3 connected downstream, since the complete analytical data are already present here, for example from earlier simulation passes. Instead, these analytical data are injected directly into the analysis system 4 via the path 14. In this way, already existing simulation results can be used for the further analysis without a repeated, time-consuming ESD simulation having to be started.

The ESD simulator 3 has a simulation path 18 in which a pre-simulator 19 and a post-simulator 20 are arranged. The simulation data 15 and the ESD stress data 16 are combined here in order to provide the input data 21 for the simulation path 18. These input data 21 are firstly injected into the pre-simulator 19. The pre-simulator 19 uses these to generate input data 22 which, in turn, form the input data for the post-simulator 20.

The items of information obtained from the input data 21 in the pre-simulator 19 are additionally injected into a permutation path 23 of the ESD simulator 3, only the data 24 from the circuit elements or circuit parts to be permuted being selected. The data 24 from the circuit elements or circuit parts to be permuted are injected into the permutation controller 25. Such a simplified permutation can, for example, provide for only those circuit elements or circuit parts which are ESD-critical, for example, to be considered. ESD-critical circuit elements circuit parts can be those which, for example, exhibit snap-back behaviour. In the post-simulator 20, therefore, under the control of the permutation controller 25, only those circuit parts or circuit blocks which are critical to finding the worst-case configurations are simulated with regard to their ESD resistance in the various ESD circuit modes, for example breakdown or snap-back.

In this way, a two-part simulation pass results, in the first simulation run (pre-simulator 19), it being defined for example which circuit parts or circuit blocks can be ESD-critical at all and, in the second simulation run (post-simulator 20), only just these critical circuit parts or circuit blocks being investigated with regard to their ESD characteristics. In the following text, this will also be designated a permutational approach.

The ESD simulator 3 also has a monitoring controller 17 (stress plan controller) for controlling the ESD simulation. The monitoring controller 17 controls the sequence of the ESD simulator 3, in particular of the pre-simulator 19, of the post-simulator 20, of the permutation controller 25 and event collector 26.

The monitoring controller 17, together with the pre-processor 10, also starts a pre-analysis of the simulation data 15 and the ESD network list. The respective circuit elements or circuit parts of an integrated circuit which can be critical for a given ESD loading are detected and, from this, firstly a reduced, optimized network list is created for the further analysis of a respective individual stress event. At the same time, permutation conditions for the permutation controller 25 are derived therefrom, according to which the existing models of these circuit elements or circuit parts detected as relevant are switched systematically into their various ESD modes. This permutation sequence is documented in the form of permutation data 24 and controlled by a permutation controller 25. The post-simulator 20 then processes the ESD result for the various model settings.

The simulation results obtained from the two simulation passes are collected in a data collector 26 connected downstream, if appropriate are processed still further or are conditioned and provided as output data 27.

The monitoring controller 17 thus controls the entire simulation of an individual ESD event. The particular advantage of the method according to the invention now consists in the fact that, here, in addition to an individual ESD event, all the other theoretically possible ESD events can likewise be treated and evaluated. It is therefore possible to the same extent to simulate and to analyse what are known as worst-case scenarios in which, while taking into account all conceivable ESD-critical conditions, an ESD simulation is carried out. However, it is not necessary for the complete simulation pass to be processed for each of these events. Instead, during the simulation of a new ESD event, findings from ESD events already simulated can also advantageously be incorporated, by which means the effort for the entire simulation can advantageously be reduced to a minimum.

The monitoring controller 17 also has the special advantage that the simulation can also be interrupted at any time. This can be expedient in particular when, during a simulation which is just beginning or is already running, the monitoring controller 17 detects that a failure of a circuit element or of a circuit part that can be attributed to an ESD event has occurred. In this case, the simulation can advantageously be interrupted immediately after the first occurrence of a fault and the findings obtained in the process about the type of failure and the location of the failed circuit element or circuit part can be collected. These data 28 can then be used to adapt the appropriate data 11, 12 suitably. As distinct from U.S. Pat. No. 6,493,850 mentioned at the beginning, the simulation does not have to be carried out as far as the end, which, in particular in the case of very complex integrated circuits, would last a very long time. In this way, the effort on simulation and the simulation time can be reduced considerably.

Furthermore, an ESD analysis system 4 is connected downstream of the ESD simulator 3. The ESD analysis system 4 has an analysis device 30. The analysis device 30 typically has a post-processor 30. The input of the analysis device 30 is supplied with the output data 27. Furthermore, data 31 are also supplied to the post-processor 30 via the path 14. As already mentioned above, the data 31 contain data for global failure criteria. In addition to the local failure criteria (data 27) for individual circuit elements or circuit parts, which are treated in the ESD simulator 3 as described above, there is advantageously the possibility here of also incorporating global failure mechanisms for the ESD test. Such global failure mechanisms can, for example, provide the extent to which, for example, adjacent circuit parts or circuit blocks influence one another positively or else negatively with regard to their ESD characteristics. These failure data 31, together with the local data 27, are injected into the analysis device 30, which then performs a simulation analysis on these data 27, 31. The analysis device 30 assesses these data 27, 31 with regard to their physical validity and meaningfulness. Simulation runs having physically relevant ESD failure criteria are marked. The data from all the ESD stress sequences and the associated permutations are treated in accordance with filter methods selected by the user and are output in an appropriate data structure 33.

The analysis device 30 therefore sets up the local failure data 27 generated in the ESD simulator 3 and, together with the global analysis criteria 31 supplied directly by the pre-processor 10, carries out further analyses of the ESD characteristics of the integrated circuit or individual circuit parts. Taking this as a starting point, design recommendations 32 can additionally or alternatively also be derived, are introduced into the product ESD concept description via the path 34 as improvement measures and close the overall design cycle. In particular, these design recommendations 32 can be used for optimizing the data 11, 12 and therefore the input data 15, 16.

Additionally or alternatively, the findings and data 33 obtained in the post-processor 30 can also be supplied to an output generator 35, which outputs these data 33.

Pre-processor 10 and post-processor 30 operate directly together with each other, so that various analytical tasks can also advantageously be carried out without repeated simulation. Here, the simulation in the ESD simulator 3 is saved, which means that a considerable amount of effort on simulation can be saved.

Figure 3:
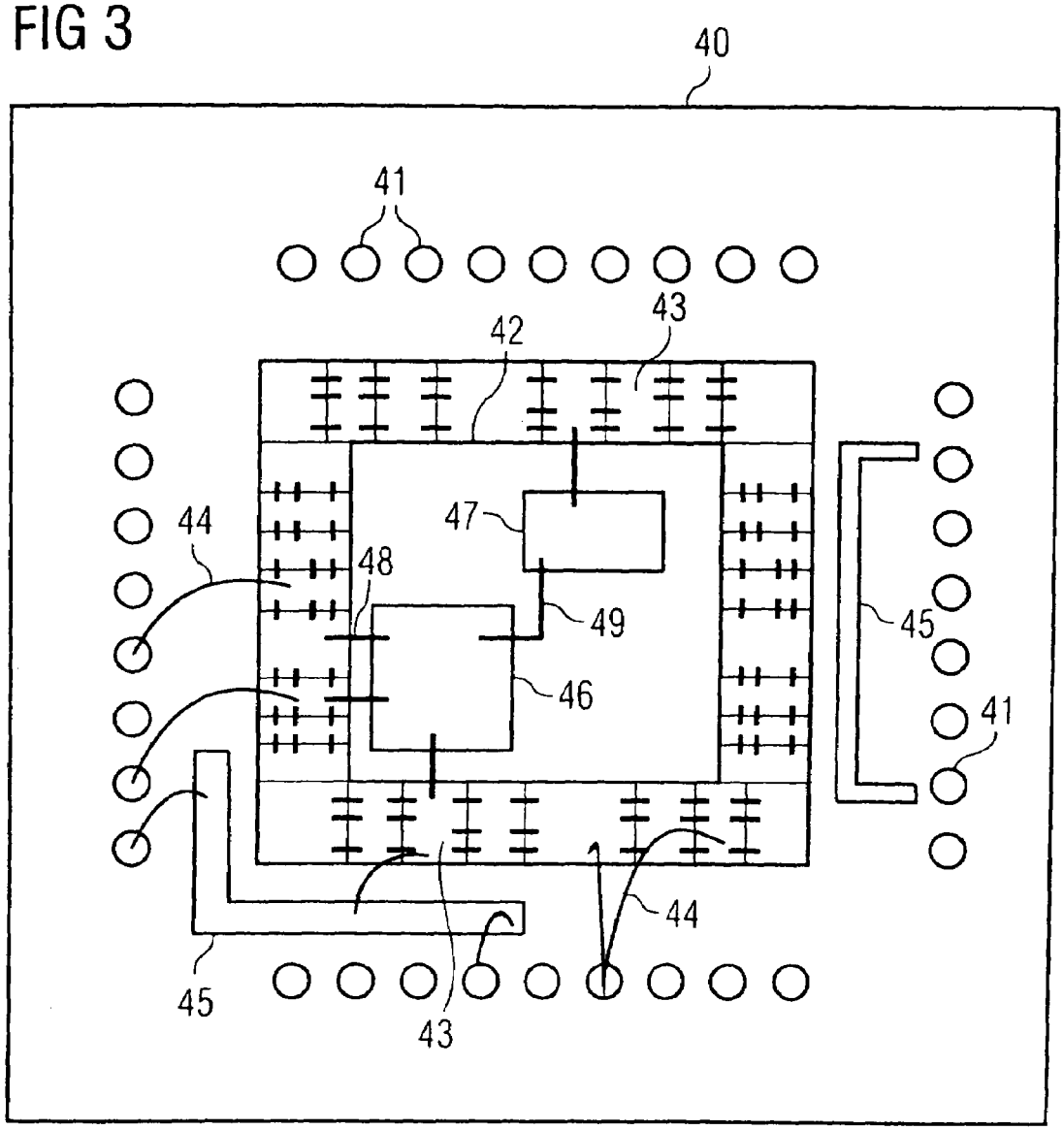
FIG. 3 is a schematic illustration, by using which the product description of an integrated circuit is described at a high abstraction level in order to analyse the ESD simulation concept.

FIG. 3 shows a schematic illustration, by using which the product description of an integrated circuit at a high level of abstraction can be used to analyse the ESD simulation concept.

Here, reference symbol 40 designates the layout of an integrated circuit. The layout 40 has on its periphery output terminals 41 (I/O ports). These output terminals 41 in this case form, for example, the bonding pads of the integrated circuit. Reference symbol 42 designates the integrated circuit. The integrated circuit 42 has on its periphery input/output cells 43 (I/O cells). Via the input/output cells 43, the integrated circuit 42 can be connected via bonding wires 44 to the output terminals 41. Furthermore, the component 40 has on its periphery conductor tracks 45 which, for example, can have a predefined potential, for example a reference potential or a supply potential, applied to them.

The integrated circuit 42 in the present exemplary embodiment contains two circuit blocks 46, 47. The circuit blocks 46, 47 are connected to the input/output cells 43 via connecting lines 48. The circuit blocks 46, 47 can also be connected to one another via further connecting lines 49. The circuit blocks 46, 47 can be formed as individual circuit elements, groups of individual circuit elements, entire functional units or the like. Typically, these circuit blocks are formed as library cells (building blocks), so that the individual elements, wiring patterns and characteristics thereof are described by the software of the respective library cell.

With conventional ESD simulation systems and methods, only the individual circuit blocks 46, 47 can be examined and simulated for their ESD resistance. The particular advantage of the ESD simulation system according to the invention and the ESD method according to the invention is now that, during the ESD simulation and analysis, the influence of these various circuit blocks 46, 47 on one another can also be incorporated. Hitherto, this was not possible with conventional simulation methods and ESD simulation systems.

Additionally or alternatively, the point at which this circuit element or circuit part 46, 47 is arranged within the respective layout 40 or the integrated circuit 42 can also be incorporated. The invention is based on the finding here that not only do the individual circuit parts and circuit blocks and their mutual influence have to be taken into account for the ESD characterization but also other elements in the layout 40 of the integrated circuit 42. In particular, the output terminals 41, the input/output cells 43, the bonding wires 44, the connecting lines 48, 49, etc., also have an influence on the ESD behaviour and the ESD resistance. By means of the method according to the invention, precisely these elements are also incorporated in the ESD verification.

An additional degree of freedom is therefore produced here, specifically with regard to where the individual circuit blocks 46, 47 are arranged within the integrated circuit 42 and how these are wired to one another.

Figure 4:
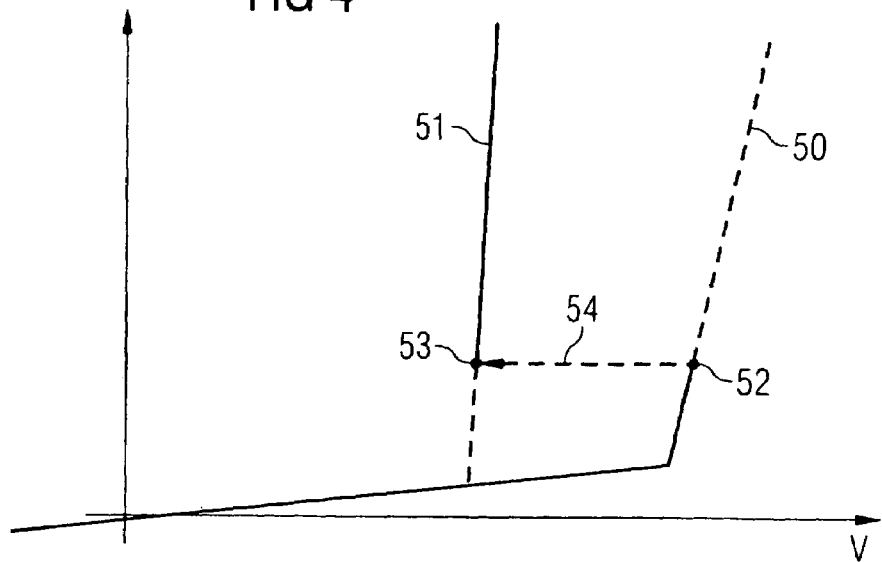
FIG. 4 shows a schematized current-voltage characteristic for a snap-back behaviour typical of an ESD event, by using which the simulation strategy according to the invention will be explained.

FIG. 4 shows a schematized current voltage characteristic for a snap-back behaviour typical of an ESD event. In the case of such a snap-back behaviour, the current typically initially rises continuously with increasing voltage, more or less linearly, and then, beginning at a specific voltage value, jumps back to lower current values. This is also designated "snap-back". A characteristic of this type, which is very typical of an ESD event, is, however, extremely difficult to describe in terms of simulation.

According to the invention, no attempt is therefore made to describe this mechanism physically correctly. Instead, the invention is based on the finding that it is completely sufficient to consider an extract from the breakdown branch 50 and an extract from the snap-back branch 51 separately from each other. In the following text, this is also designated a permutational approach to describing an ESD event. During an ESD simulation, therefore, initially only those values which are arranged along the breakdown characteristic 50 as far as the snap-back point 52 are used. Beginning from the stopping point 53, the snap-back characteristic 51 is used. The direct snap-back 54 is not modelled here, since, firstly, this is very complicated for the ESD characterization and, secondly, it is not relevant either.

The characteristic paths of the snap-back characteristic illustrated dashed in FIG. 4 are typically not used in an ESD event with snap-back. Consequently, these regions can also be excluded during the simulation. As a result, the effort on simulation for a snap-back event also decreases. A time saving obtained in this way lies for the major part in the possibility of now assessing the integrated circuit with regard to its ESD characteristics with a pure DC analysis instead of by means of a transient analysis. Of course, added to this are the extremely simplified models, network lists, etc.

For the simulation of an ESD event, only the areas of the continuous regions of the characteristics 50, 51 are therefore relevant. This already results in a very good approximation to a snap-back event.

Figure 5:
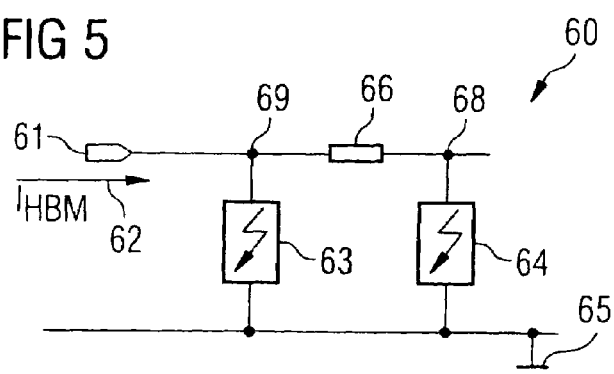
FIG. 5 shows a simplified ESD circuit to illustrate the permutational ESD simulation method.
Figure 6:
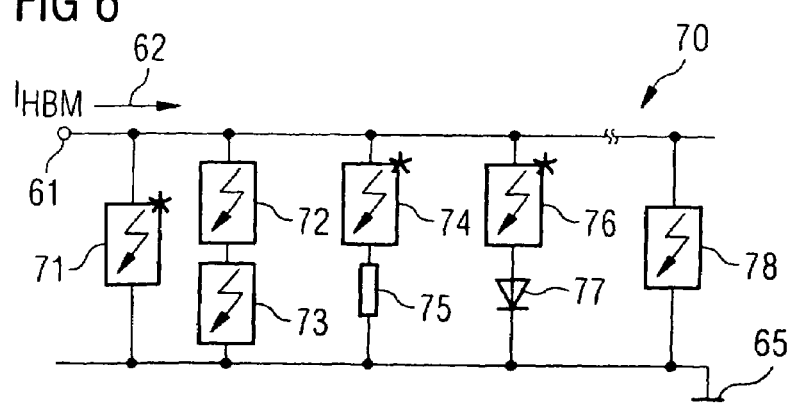
FIG. 6 shows an ESD circuit to illustrate what is known as the pre-run selection method.

The simulation algorithm according to the invention is to be illustrated by using the following FIGS. 5 and 6.

In FIG. 5, reference symbol 50 illustrates a simple ESD circuit to illustrate the permutational ESD simulation method. The ESD circuit 60 contains an input 61, into which an ESD signal 62, for example an HBM current pulse, is injected. The first circuit 60 has two preferably identical ESD protective elements 63, 64, which are arranged in parallel with each other and are arranged between the input 61 and a terminal for a supply potential 65, for example the reference potential. In this case, the ESD protective element 63 is connected directly to the input 61, whereas the ESD element 64 is connected to the input 61 via a resistor 66. The resistor 66 is thus arranged between the two junctions 67, 68.

For the purpose of simulation, an ESD current $I_{HBM}$=1.3 amps is injected into the ESD circuit 60. In order to describe each ESD element 63, 64, which, for example, can be formed as an NMOS transistor connected to a reference potential, with regard to its ESD characteristics by using the two breakdown characteristics from FIG. 3, a total of four simulation passes are required.

Table 1 shows the ESD parameters and circuit parameters of the ESD circuit from FIG. 5.

TABLE 1

| Parameter | Value |
| --- | --- |
| VBR | 10 V |
| RBR | 20 Ohm |
| ITR | 10 mA |
| VSP | 5 V |
| RSP | 2 Ohm |
| RI | 5 Ohm |
| $I_{HBM}$ | 1.3 AV |

Table 2 lists the simulation results for all of the possible (four) permutations, the number in the first column, which represents the permutation index, representing in binary form whether the first ESD protective element 63 (first digit) or the second ESD protective element 64 (second digit) is designated. A "0" in the permutation index stands for the breakdown parameter (VBR, RBR), and a "1" for a snap-back parameter set (VSP, RSP).

TABLE 2

| Perm. index | Junction 67 potential | Junction 68 potential | ESD current (Jn 67) | ESD current (Jn 68) |
| --- | --- | --- | --- | --- |
| (00) | 24 V | 21 V | 0.73 A | 0.57 A |
| (01) | 13 V | 7.3 V | 0.15 A | 1.15 A |
| (10) | 7.6 V | 7.6 V | 1.3 A | 0 |
| (11) | 7.0 V | 5.6 V | 1 A | 0.3 A |

The second and third column designates the potentials at junction 67 and 68, respectively, and the fourth and fifth columns designate the current through the first ESD element 63 and the second ESD element 64, respectively. As expected, the potentials at the junctions 67, 68 differ significantly between the permutations.

At this point, it should be noted that the third line, which has a permutation index "01", designates an unrealistic and physically inexpedient simulation pass. This permutation with the ESD element 63 in breakdown and with the ESD element 64 in snap-back mode leads to a current of 0.15 amps through the ESD element 63, which is on the far side of its trigger current point, so that the ESD element should rather be modelled in the snap-back mode. However, this case is already covered by the simulation pass having the permutation index "11". Therefore, the simulation pass "01" can be marked as invalid and does not need to be taken into account further. The same applies to the simulation pass "00", which leads directly to two valid and physically expedient simulation passes having the permutation indices "10" and "11" being left over. For the ESD analysis, however, only the worst-case situation is interesting. This worst-case situation occurs with a maximum voltage drop of 7.6 volts at junction 68. This worst-case situation can be used for the permutational simulation method, by an ESD simulation being carried out only for junction 68.

Standard complex simulations would converge in only one of the valid permutations, but this does not necessarily represent the worst-case configuration. In such cases, a Monte Carlo method would additionally have to be used in order to find critical ESD paths reliably. At this point, it should be emphasized once more that, with the permutational approach according to the invention, a DC analysis is only advantageously adequate to find all the critical ESD current paths and voltage distributions, while conventional compact simulations need transient analyses in order to determine the elements which lead into a snap-back mode. However, this requires a very much higher effort on simulation. The number of simulation passes required for N snap-back elements is $2^N$ and, for very complex large circuit arrangements, would very quickly no longer be able to be handled. For this reason, in the simulation according to the invention, what is known as a pre-run procedure is used first, which is used before the permutation method, in order to determine from all the circuit elements and circuit parts which possibly exhibit snap-back behaviour those which can actually reach the snap-back mode for a given stress condition or a given interference pulse.

In an individual simulation pass, a maximum possible current $I_{max}$ on the breakdown path of the characteristic of each snap-back element is extracted. If $I_{max}$ is smaller than ITR, precisely this circuit part or circuit element no longer has to be taken into account, since it cannot reach snap-back. Conversely, all of the circuit elements in which $I_{max}$ is greater than ITR and in which, at the same time, there is a maximum ratio $I_{max}$/ITR can be obtained from this. This approach will be explained below by using FIG. 6.

FIG. 6 shows a representation of an ESD circuit 70, by using which a pre-run selection mentioned above can be performed in order to be able to determine critical snap-back elements within the permutation method. Here, various paths which are arranged in parallel with one another and which have different ESD protective elements are illustrated. An individual ESD protective element 71 is arranged in the first path. This individual ESD protective element 71 has a low breakdown voltage and is thus to be considered as critical. As distinct from this, a series circuit comprising two ESD protective elements 72, 73 is arranged in the second path, which thus have a high breakdown voltage and therefore preferentially do not break down. Provided in the third path is a series circuit comprising a resistor 75 and an ESD protective element 74, the ESD protective element 74 also being critical here. The same applies to the fourth path, in which an ESD protective element 76 is arranged in series with a diode 77. Arranged in the last path is an individual ESD protective element 78, which is not critical. With all the snap-back elements which are brought into a breakdown mode and which have circuit parameters corresponding to the example in Table 1, the ESD protective elements identified by a cross have a current I>>ITR, which flows through these and which can be viewed as ESD-critical. In this simplified example, the number of ESD elements exhibiting snap-back behaviour can be reduced from six snap-back elements to three. For highly complex integrated circuits, the number of snap-back elements which would have to be taken into account for the simulation can be reduced quite considerably, which leads directly to a reduction in the effort on simulation.

In summary, therefore, it is possible to determine that the simulation system according to the invention and the method according to the invention satisfy the following requirements for an ESD design system:

A) Creation of a Network List for the ESD Simulation:

Cells of an integrated circuit, in particular its I/O cells, are firstly ESD-tested in an individual qualification sequence, simulated and/or checked, for example by ESD experts. This is also possible at this time since the quantities of data are still comprehensible. For these already evaluated cells, abstracted ESD network lists are then produced. These network lists comprise resistors, breakdown elements or snap-back elements which describe the breakdown and high-current characteristics of ESD protective elements or circuit elements, and voltage sensors which monitor critical voltage drops or critical parasitic elements.

With the aid of an allocation table, identical or identical types of I/O cells are in each case assigned to the same ESD network list from ESD points of view. In this connection, identical or identical types means that the respective circuit elements or circuit parts exhibit identical ESD characteristics in the case of a predefined ESD event. By means of this measure, the total number of the ESD network lists to be produced for I/O cells can be reduced drastically. For example, a number of 15-20 ESD network lists obtained in this way is already sufficient to describe a cell library comprising about 100-150 individual cells sufficiently well with regard to their ESD characteristics.

On the basis of a list which describes the arrangement of the individual cells in the semiconductor chip (I/O cells in the pad ring), the individual network lists are combined into an overall network list.

On the basis of a list of current-carrying connections in the chip core, the current paths are added to the (pad ring) network list obtained in this way. The network list resulting from this is finally supplemented by the connections in the housing of the semiconductor chip, including the bond-outs.

The combination of the component ESD concept comprising individual components has been described above using the schematic illustration in FIG. 3.

B) Availability of the ESD Network List in the Early Phase of the Design:

Since the cell libraries are already available at the starting point of the chip design, the overall network list can already be created with the textual description of the pad ring, of the package paths, of the bond-outs and of the current-carrying paths in the chip core. This likewise means that, in a very early concept phase, that is to say even before the creation of the wiring layout and of the circuit design (overall schematic), the overall network list can be produced and a first ESD analysis of the chip by simulation can be carried out. In this way, corresponding results can already be taken into account in the concept phase without additional effort, which advantageously results in a very great saving in computational effort and computational power for the ESD simulation and therefore in computing time.

C) Hierarchical Simulation Approach:

Using the method described above under A) for the creation of the ESD network list, the advantages of a hierarchical simulation system have already been exhausted. However, the individual cells for their part again comprise some hundreds of circuit elements and parasitic circuit parts. These can be investigated and optimized appropriately in an ESD simulation, for example by means of a method outlined under D). As a result of this analysis by simulation or a test method on an integrated circuit appropriately implemented in semiconductor material, a simplified ESD model, that is to say a simplified ESD network list, is created. This simplified network list contains all the elements which contribute significantly to the ESD current path, however. By equipping the simplified model with current and voltage sensors, in accordance with the previous analysis of the failure conditions in the ESD stress, all the substantial failure mechanisms of the respective cell can be checked and illustrated.

In this way, the individual cell contributes only about 10-20 individual elements to the overall network list instead of some 100 individual elements. By means of this simplification, a simulation of the entire semiconductor chip frequently becomes possible for the first time. At least, however, this simplification leads to a significant increase in the overall simulation speed and the stability of the simulation.

D) Simulatory Description of the ESD Behaviour:

An important aspect of the method according to the invention results from the permutational simulation method for describing the snap-back behaviour. Previous simulation approaches attempted to reproduce the ESD behaviour of the circuit or protective transistors by means of a very compact, less abstract model comprising many individual components. The high complexity of the compact models employed there led to a great deal of effort in parameter extraction and therefore to exorbitantly long computing times, however. Ultimately, the high complexity of the simulation frequently also led to numerical instabilities on the simulation side.

However, it is necessary to take the breakdown behaviour and the snap-back mechanism into account in order to be able to predict critical current paths at the level of the semiconductor chip. According to the invention, this problem is solved by a considerable simplification of the model which is required for a simulation of an ESD event. This simplified model has already been described above using FIG. 4.

It should be emphasized here again that this method already takes account of technological and design-induced parameter scatter. The method can advantageously be carried out with a pure DC analysis, which represents a significant advantage as compared with previous AC analyses taking transient effects into account.

E) Taking Account of Fluctuations in the ESD Parameters of the Individual Elements:

With the permutational approach to carrying out the simulation method, described under D), scatter in the ESD parameters, which can lead to an opening of different ESD paths during an ESD event on the semiconductor chip, are additionally already taken into account. This is a great advantage of the method according to the invention as compared with known methods.

A further advantage is that the simulation can be carried out with pure DC analysis, and therefore the transient behaviour of the circuit does not have to be investigated in order to find critical ESD paths. This permits, firstly, a considerably reduced characterization effort for the circuit elements and circuit parts with respect to their transient behaviour. Secondly, it permits a drastic acceleration in the simulation of the overall semiconductor chip itself.

F) Reduced, Tolerable Modelling Effort for the ESD Elements:

Although the approach presented here uses highly simplified models, for this purpose it is based on an analysis similar to a Monte Carlo analysis. The models can be derived by means of a determination of the fundamental ESD parameters, so that, in parallel with the technological development, a simulation environment can already be set up and even used for prototypes of the circuit to be developed. According to the invention, the computational effort for configuration of the models, required for this purpose, is drastically reduced.

Although the present invention has been described in detail above by using a preferred exemplary embodiment, it is not restricted thereto but can be modified in many ways.

| List of reference symbols | |
|---|---|
| 1 | ESD simulation system |
| 2 | Documentation system for the ESD concept |
| 3 | ESD simulator, ESD test simulation system |
| 4 | Analysis system |
| 10 | Pre-processor |
| 11 | (Input) data |
| 12 | (Input) data |
| 13 | (Input) data |
| 14 | Path |
| 15 | (Output) data |
| 16 | (Output) data |
| 17 | Simulation controller |
| 18 | Simulation path |
| 19 | Pre-simulator |
| 20 | Post-simulator |
| 21 | Input data (for the pre-simulator) |
| 22 | Input data (for the post-simulator) |
| 23 | Permutation path |
| 24 | Input data (for the permutation controller) |
| 25 | Permutation controller |
| 26 | Result collector |
| 27 | Output data, global failure data |
| 30 | Analysis device, postprocessor |
| 31 | Global failure data |
| 32 | Design recommendations |
| 33 | (Output) data |
| 34 | Path |
| 35 | Output generator |
| 40 | Semiconductor component |
| 41 | Output terminals |
| 42 | Integrated circuit |
| 43 | Input/output cells, I/O cells |
| 44 | Bonding wires |
| 45 | Conductor tracks |
| 46 | Circuit block, library cell |
| 47 | Circuit block, library cell |
| 48 | Connecting line |
| 49 | Connecting line |
| 50 | Breakdown characteristic |
| 51 | Snap-back characteristic |
| 52 | Snap-back point |
| 53 | Stopping point |
| 54 | Snap-back |
| 60 | ESD circuit |
| 61 | Input |
| 62 | HBM current pulse |
| 63, 64 | ESD protective elements |
| 65 | Reference potential |
| 66 | Resistor |
| 67, 68 | Junctions |
| 70 | ESD circuit |
| 71-74 | ESD protective elements |
| 75 | Resistor |
| 76 | ESD protective element |
| 77 | Diode |
| 78 | ESD protective element |

The invention claimed is:

1. A program-controlled arrangement for identification of ESD and/or latch-up weak points in a design or in a concept of an integrated circuit, the arrangement comprising:
a pre-processor, configured to process data about a description of the integrated circuit and about ESD-characterized circuit parts of the integrated circuit and information about ESD test standards, in order to create an abstracted network list for an ESD simulation, the abstracted network list having less data than is required for a complete depiction of the integrated circuit;
a simulator device operably connected to receive the abstracted network list from the pre-processor, the simulator device having a simulator configured to perform the ESD simulation of the integrated circuit using the abstracted network list, the simulator device having a monitoring controller configured to control an ESD simulation sequence in the simulator; and
an analysis device operably connected to the simulator device, the analysis device operable to perform an evaluation of data generated in the simulator device with regard to physical validity and meaningfulness using a permutational analysis and to mark simulation runs having physically relevant ESD failure events.

2. The arrangement according to claim 1, wherein the description of the integrated circuit contains data about a pad ring, housing, bond-out chip, individual cells of the integrated circuit, connecting lines, and I/O ports.

3. The arrangement according to claim 2, wherein the description of the ESD-characterized circuit parts of the integrated circuit comprises an ESD database that stores data about previously ESD-verified and ESD-characterized circuit parts.

4. The arrangement according to claim 3, further comprising a failure circuit configured to generate the information about ESD test standards, the failure circuit corresponding to the HBM model, the MM model and/or the CDM model.

5. The arrangement according to claim 1, wherein the description of the ESD-characterized circuit parts of the integrated circuit comprises an ESD database that stores data about previously ESD-verified and ESD-characterized circuit parts.

6. The arrangement according to claim 1, further comprising a failure circuit configured to generate the information about ESD test standards, the failure circuit corresponding to the HBM model, the MM model and/or the CDM model.

7. The arrangement according to claim 1, wherein the simulator has a simulation path comprising a first simulator and a second simulator connected downstream of the first simulator, the first and the second simulator being connected to the monitoring controller.

8. A method for the identification of ESD and/or latch-up weak points in the design or in the concept of an integrated circuit, comprising:

a) using a pre-processor to process data about a description of the integrated circuit and about ESD-characterized circuit parts of the integrated circuit and information about ESD test standards, in order to create an abstracted network list for an ESD simulation, the abstracted network list having less data than is required for a complete depiction of the integrated circuit;

b) employing a simulator device to perform the ESD simulation of the integrated circuit, and to control the ESD simulation sequence in the simulator; and c) employing an analysis device to perform an evaluation of data generated in the simulator device with regard to physical validity and meaningfulness using a permutational analysis and to mark the simulation runs having physically relevant ESD failure events.

9. The method according to claim 8, further comprising modifying the abstract network list for use in a further simulation.

10. The method according to claim 8, wherein steps b) and c) further comprises incorporating a mutual influence of various circuit parts of the integrated circuit for an ESD failure analysis.

11. The method according to claim 8, further comprising performing ESD modelling of a snap-back event using only those values from a snap-back characteristic in which current rises continuously with increasing voltage.

12. The method according to claim 8, wherein step b) further comprises employing the simulator device to simulate a plurality of theoretically possible ESD modes of the integrated circuit.

13. The method according to claim 8, wherein step b) further comprises employing the simulator device to perform the simulation taking into account inaccuracies, scatter and/or technology-induced fluctuations in ESD-critical component parameters for at least one circuit part of the integrated circuit.

14. The method according to claim 8, further comprising performing multiple simulation passes for a multiple ESD events, and incorporating findings and data from previous simulation passes during a simulation pass of a new ESD event.

15. The method according to claim 13, wherein a simulation is interrupted during a running simulation pass following an occurrence of a failure of a circuit part of the integrated circuit that can be attributed to an ESD event.

16. The method according to claim 8, further comprising, performing an ESD optimization of at least one circuit part of the integrated circuit prior to step a).

17. The method according to claim 8, wherein step b) further comprises employing a simulation device to perform the ESD simulation using a hierarchical simulation approach, in which, for the simulation of the integrated circuit, previously ESD-simulated and/or ESD-tested circuit parts of the integrated circuit are replaced by a simplified and/or abstracted ESD model.

18. A method for identification of ESD and/or latch-up weak points in a design or in a concept of an integrated circuit, comprising:

a) using a pre-processor to process data about a description of the integrated circuit and about ESD-characterized circuit parts of the integrated circuit and information about ESD test standards, in order to create an abstracted network list for an ESD simulation, the abstracted network list having less data than is required for a complete depiction of the integrated circuit;

b) employing a simulator device to perform the ESD simulation of the integrated circuit using a simulation path having a first simulator and a second simulator operably coupled to the first simulator, and to control the ESD simulation sequence in the simulator device; and c) employing an analysis device to perform an evaluation of data generated in the simulator device with regard to physical validity and meaningfulness and to mark the simulation runs having physically relevant ESD failure events.

19. The method according to claim 18, wherein steps b) and c) further comprises incorporating a mutual influence of various circuit parts of the integrated circuit for an ESD failure analysis.

20. The method according to claim 19, further comprising performing an ESD modelling of a snap-back event using only those values from a snap-back characteristic in which current rises continuously with increasing voltage.

* * * * *